United States Patent [19]

Hampel et al.

[11] 3,900,742

[45] Aug. 19, 1975

[54] THRESHOLD LOGIC USING COMPLEMENTARY MOS DEVICE

[75] Inventors: Daniel Hampel, Westfield; Kalman J. Prost, East Windsor; Norman R. Scheinberg, Fort Lee, all of N.J.

[73] Assignee: The United States of America as represented by the Secretary of the Navy, Washington, D.C.

[22] Filed: June 24, 1974

[21] Appl. No.: 482,306

[52] U.S. Cl. ................. 307/211; 307/205; 307/215

[51] Int. Cl.[2] ............... H03K 19/42; H03K 19/08; H03K 19/36

[58] Field of Search ........... 307/205, 211, 215, 214

[56] References Cited

UNITED STATES PATENTS

| | | | |
|---|---|---|---|
| 3,439,185 | 4/1969 | Gibson | 307/205 |
| 3,458,240 | 7/1969 | Hanson | 307/211 X |
| 3,715,603 | 2/1973 | Lerch | 307/215 X |
| 3,717,868 | 2/1973 | Crawford et al. | 307/215 X |
| 3,737,673 | 6/1973 | Suzuki | 307/205 |
| 3,753,009 | 8/1973 | Clapper | 307/215 X |
| 3,760,380 | 9/1973 | Hoffman et al. | 307/279 X |

OTHER PUBLICATIONS

Gurski, "FET Logic Bridge Circuit," IBM Tech. Discl. Bull, Vol. 11, No. 7, pp. 812, 12/1968.

*Primary Examiner*—Michael J. Lynch
*Assistant Examiner*—L. N. Anagnos
*Attorney, Agent, or Firm*—R. S. Sciascia; Henry Hansen

[57] ABSTRACT

Complementary MOS (CMOS) devices form a plurality of threshold gate configurations having majority logic functions with near symmetrical switch delay times. Corresponding gate terminals of individual MOS devices within identical N and P channel complementary networks are commonly connected and adapted to receive input signals. Operating voltages are connected to the respective sources of the N and P channel networks and the network drains are commonly connected to provide an output.

7 Claims, 4 Drawing Figures

THRESHOLD LOGIC USING COMPLEMENTARY MOS DEVICE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to digital gating circuits and particularly to threshold gates having majority logic functions which are implemented by CMOS devices.

Sophisticated digital processing systems require that digital information be processed quickly utilizing a minimum of electronic devices which ideally would require only nominal current drain and operate at relatively fast switching speeds. Prior implementations of threshold logic have utilized bipolar devices, single channel N or P MOS, and analog circuitry. The number of bipolar devices necessary to implement a threshold function is relatively complex and draws substantial current even during quiescent state operating conditions. Similarly, single channel MOS requires that one transistor within the gate network be employed to provide a load with consequentially greater current being drawn and increased switching times. Analog implementation of threshold functions utilizing resistor summing networks in conjunction with a comparator experience the inaccuracies inherent within the resistor network necessary to sum the input currents as well as possible instabilities within the comparator. Additionally, the analog approach requires relatively large packaging.

SUMMARY OF THE INVENTION

Accordingly, it is an object of the present invention to provide threshold gates having majority logic functions through the use of CMOS devices. Another object is to equalize the switch delay times of threshold gate devices which provide majority logic functions.

Briefly, these and other objects are accomplished by implementing threshold gates having a majority logic function through the use of identical N and P channel network CMOS devices. A majority function threshold gate has a number of inputs with each input being assigned a weight value. For the majority function case, the sum of the input weights must be odd and the corresponding threshold is then set at one half of the sum of the weighted inputs plus one. CMOS threshold gates which implement logic functions use complementary N and P networks which are duals of each other. The duals for majority functions are the same, however, and both N and P channel network configurations are accordingly identical. The majority function is implemented through the identical N and P channel networks by selection of either parallely or serially connected single channel MOS gates to denote, respectively, an OR function or an AND function as required by the majority logic expression. Complementary gate terminals within the N and P channel networks are commonly connected and adapted to receive respective gate input signals. The threshold gate output is provided by a common connection of the drains from both the N and P networks. Supply voltages are connected to the source terminals of both the P and N networks.

Since the N and P networks are identical, the turn-on delays are more nearly equal to the turn-off delays and the switching times, accordingly, become substantially symmetrical. The CMOS threshold gate also provides other logic functions by strapping inputs together or biasing predetermined inputs to either high or low signals levels.

For a better understanding of these and other aspects of the invention, reference may be made to the following detailed description taken in conjunction with the accompanying drawings.

DESCRIPTION OF THE PREFERRED EMBODIMENT

Figure 1:
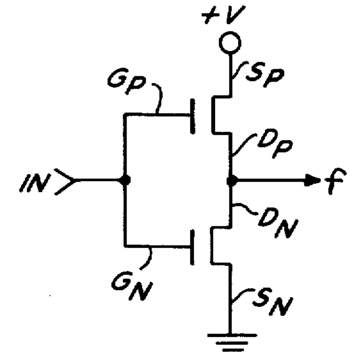
PRIOR ART FIG. 1
FIG. 1 is a schematic diagram of a prior art logic inverter using a CMOS device.

The most basic type of a threshold gate is a three input logic gate wherein each of the inputs $X_1$, $X_2$, $X_3$ has a unity numerical weight value. In this case, a threshold T is set equal to two in order to provide a majority logic function. Obviously, if two or more of the inputs are active, the majority gate would provide an output $f$ indicative of this situation. Should the number of active inputs be less than the predetermined threshold T, the output $f$ assumes an inactive state. Accordingly, the Boolean expression representative of the output of an inverting three input majority gate is:

$$\bar{f} = X_1X_2 + X_1X_3 + X_2X_3;$$

which, in a reduced form, becomes $$\bar{f} = X_1(X_2 + X_3) + X_2X_3.$$

In addition to providing the majority logic function, the three input threshold gate is also capable of producing AND or OR functions providing that appropriate inputs are tied to either an active (1) state or an inactive (0) state. For example, if the $X_1$ input is biased to a 0 state, the threshold gate provides an AND function. Similarly, if input $X_1$ is biased to the 1 state, the threshold gate provides an OR function. Note that the threshold T=2 continues to be satisfied in all logic configurations.

Another example of a more complex threshold gate is a gate having four inputs $X_1$, $X_2$, $X_3$, $X_4$ with respective numerical weights of 2, 1, 1, 1, wherein the threshold T is chosen to provide a majority function. The threshold T for any size majority gate having a number of weighted or unity value is most easily calculated according to the formula $T = (s + 1/2)$ wherein $s$ is the sum of the weighted values of the respective gate inputs. Accordingly, in the latter example, the sum $s$ of the weighted inputs is equal to 5, and the threshold T is easily calculated to be 3. The weight value is a numerical assignment for each of the threshold gate inputs and these numbers are indicative of the relative significance of the activation of one particular threshold gate input signal to some other threshold gate input signal. The reduced Boolean expression indicative of the output of the foregoing four input threshold gate is $\overline{f}=X_1(X_2+X_3+X_4)+X_2X_3X_4$. By strapping certain inputs together or biasing particular inputs to a high or low state, the four input threshold gate is capable of producing seven other nonobvious distinct logical function types, each one of which satisfies the majority logic function. For example, the AND function expression $\overline{f} = X_2X_3X_4$ can be logically implemented from the four input threshold gate by biasing input $X_1$ to a 0 state. The six remaining function types which illustrate the majority function either through biasing or strapping particular inputs are

*a.* $X_1(X_2 + X_3 + X_2X_3$,
*b.* $X_2 + X_3 + X_4$,
*c.* $X_2X_3$,
*d.* $X_2 + X_3$,
*e.* $X_1 + X_2X_3$, and
*f.* $X_1 (X_2 + X_3)$.

Thus the four input threshold is capable of providing eight nonobvious logic function types and each of which complies with majority logic constraints.

Referring now to FIG. 1 there is shown a well known logic inverter circuit utilizing enhancement type CMOS technology. CMOS devices inherently comprise complementary N and P channel MOS transistors. Each of the N and P channel devices contains a gate, a source, and a drain. The source Sp of the P channel device is connected to a voltage source +V and the source $S_n$ of the N channel device is connected to ground. The respective drains $D_n$, $D_p$ of both the N and P channel devices are commonly connected to provide an output $f$ from the inverter. The gates $G_n$, $G_p$ of both the N and P single channel devices are commonly connected and adapted to receive an input signal. In operation, one or the other of the single channel devices within the CMOS is always conducting while the complementary channel is nonconducting. The source $S_n$ of the N channel device need not necessarily be connected to ground but need only be connected to a voltage potential somewhat less than the potential applied to the source $S_p$ of the P channel device. The differential voltages applied to the respective sources of the N and P channels may be conveniently representative of conventional logic voltage levels. For example, the voltage V applied to the source $S_p$ of the P channel network may be five volts with the source $S_n$ of the N channel network connected to ground. Therefore a five volt level would indicate an active (1) signal and a ground level an inactive (0) signal. In operation, a 0 level applied to the input of the inverter will cause the P channel device to conduct and the N channel device to shut off. Accordingly, the output $f$ assumes a voltage level equal to V. Alternatively, an active (1) signal at the input causes the N channel device to conduct and the P channel device to shut off, thereby providing a low level (0) or ground output. In either logic state, one single channel MOS transistor is on while the other is off. Consequently, the quiescent power consumption, which is equal to the product of the supply voltage and the off unit leakage current, is extremely low and the complementary structure results in a near ideal input to output transfer characteristics. The switching point of the CMOS inverter is typically midway (45 to 55%) between the 0 and 1 logic levels. Accordingly, the inverter has high dc noise immunity because the output does not switch until the input voltage raises to nearly half the supply voltage V, and the delay times for turn on and turn-off are substantially symmetrical.

Figure 2:
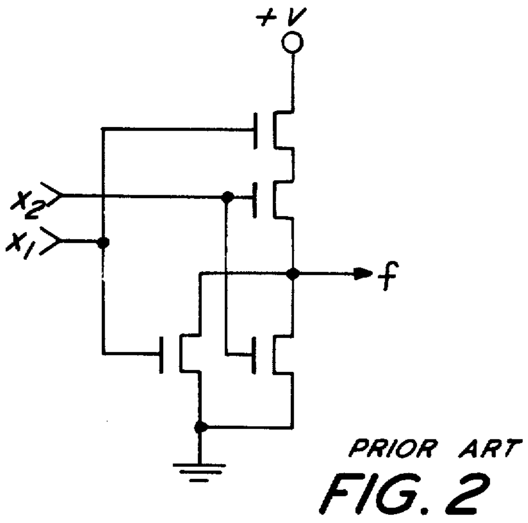
PRIOR ART FIG. 2
FIG. 2 is a schematic diagram of prior art circuitry for implementing a NOR logic gate using CMOS technology.

Once the reduced Boolean expression is obtained for a logic threshold function, a direct electronic implementation using N and P networks of complementary MOS devices is readily developed. As noted earlier, the N and P networks are duals of each other. In NOR or NAND gates, for example, a series string of one channel devices must be used with a corresponding parallel group of devices in the other channel. FIG. 2 illustrates a conventional NOR logic gate that uses CMOS devices. The NOR gate has two inputs $X_1$, $X_2$, and an output $f$. The NOR gate is developed from a series connected arrangement of two P channel MOS devices and a parallel arrangement of two complementary N channel MOS devices. The $X_1$ and $X_2$ inputs are each respectively connected in common to complementary gates of the N and P channel networks. The parallely connected N channel network is connected between the output $f$ and ground, and the complementary series connected P channel network is connected between a voltage source +V and the output $f$.

The present invention concerns itself with the application of CMOS devices to threshold logic gates which provide a majority logic function. The requirement of dual logic implementation for a majority function case can be considerably simplified, however. For a majority logic function, the Boolean expression and its dual are identical. For example, in a three input gate that produces a majority logic function with a threshold of 2, the output logic expression is $\overline{f}= X_1X_2 + X_1X_3 + X_2X_3$. The dual of the foregoing expression is $\overline{f} = (X_1 + X_2)(X_1 + X_3)(X_2 + X_3)$. Both of the foregoing logic expressions can be reduced to the same expression. Because of the identity relationship of a majority logic function and its dual, the complementary N and P channel CMOS networks which implement the majority gate are identical. Accordingly, the turn-off and turn-on time delays within the CMOS become substantially symmetrical. Working with symmetrical time delays, the design engineer need only concern himself with a single time frame and need not deal with a multitude of "worst-case" design criteria. Moreover, network development time is significantly reduced due to the convenience of laying out only one of the two required networks. The complementary network is subsequently copied directly from the first developed network.

Figure 3:
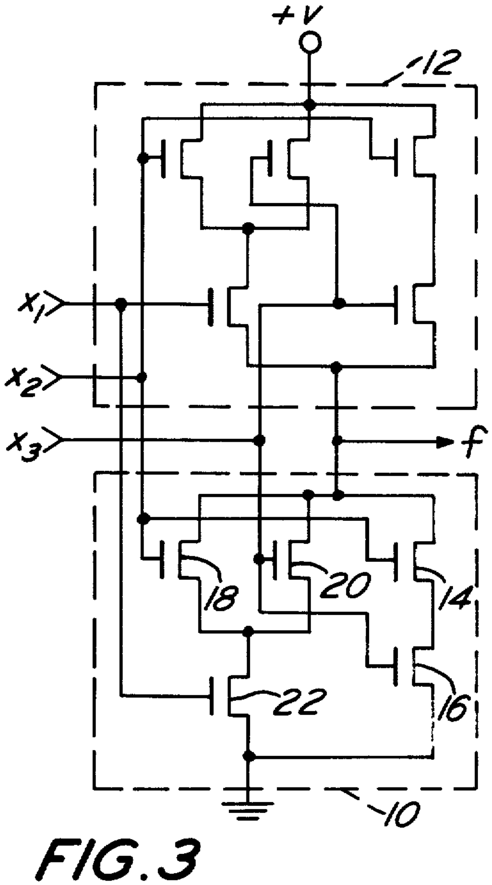
FIG. 3 is a schematic diagram of a symmetrical three input majority threshold gate developed according to the present invention.

Referring now to FIG. 3, there is shown a schematic diagram of interconnected MOS devices which produce the majority logical function for a three input threshold gate. An N channel network 10 and a P channel network 12 are identical in their respective designs. As noted earlier, the Boolean majority expression for the output of a three input threshold gate can be reduced to $\overline{f}= X_1(X_2 + X_3) + X_2X_3$. The CMOS implementation is readily developed from the Boolean equation by noting the appropriate logic functions that interconnect the terms in the expression. AND logic functions are implemented by placing MOS devices in series, with each device corresponding to a particular threshold gate input. OR logic functions are implemented by connecting MOS devices in parallel with each device representative of a particular threshold gate input. For the gate illustrated in FIG. 3, MOS devices 14, 16 which are connected, respectively, to inputs $X_2$, $X_3$ are serially connected to form one leg of the N network 10. The drain of MOS device 14 is connected to the output $f$ and the source of device 16 is connected to ground thereby forming an AND function between gate inputs $X_2$, $X_3$. Obviously, for current to flow through this leg of the network, both devices 14 and 16 must be simultaneously turned on. A second leg of the N network is developed by first noting the required OR function between inputs $X_2$ and $X_3$ in the Boolean expression, and the corresponding parallel connection between devices 18, 20 with corresponding inputs $X_2$, $X_3$ which have their drains commonly connected to the output $f$ of the network. Input $X_1$ is required to satisfy an AND function with the OR combination of inputs $X_2$, $X_3$. Accordingly, a single MOS device 22 having its gate connected to input $X_1$ is placed in a series connection with the parallel combination of MOS devices 18, 20. The source of the MOS device 22 is connected to ground and the drain is connected in common with the sources of the parallelly connected MOS devices 18, 20. Consequently, the other leg of the N network 10 is now implemented to perform the logic function $X_1(X_2 + X_3)$. Thus, there has now been provided an interconnected network of N channel MOS devices indicative of the majority logic function present at the output $f$ of a three input threshold gate shown in FIG. 3. As noted earlier, the P channel network 12 is identical to the N channel network 10 and is therefore readily developed. In developing the N and P channel CMOS networks, the individual MOS transistors are serially connected in a source to drain configuration with the ultimate source being connected to a voltage supply and the ultimate drain being connected to the output. When parallel connections are required, the individual MOS devices are connected source-to-source and drain-to-drain. The gates of complementary MOS devices having common inputs are all connected in common.

Figure 4:
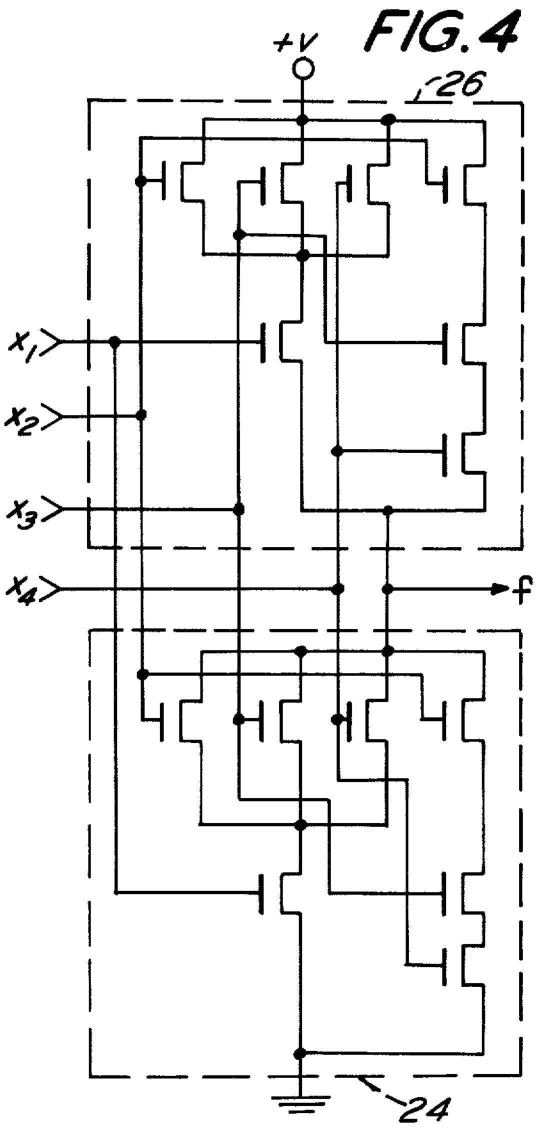
FIG. 4 is a schematic diagram of an asymmetrical four input majority threshold gate developed according to the present invention.

Referring now to FIG. 4, there is shown a schematic diagram of interconnected MOS devices within an N channel network 24 which is indicative of a more complex majority logic output function corresponding to the operation of a four input threshold gate having inputs $X_1$, $X_2$, $X_3$, $X_4$ which are respectively weighted 2, 1, 1, 1. As earlier noted, the reduced Boolean logic expression for this gate is:

$$f = X_1(X_2 + X_3 + X_4) + X_2X_3X_4.$$

Again, those devices having inputs which require an AND logical relationship are shown serially interconnected and those MOS devices having inputs which require an OR logical relationship are shown connected in parallel. The P channel network 26 is identical to the N network 24.

The threshold gate shown in FIG. 3 is a symmetrical majority gate in that each of the inputs has a single unity value. The threshold gate shown in FIG. 4 is asymmetric in that the inputs have differing numerical weight values. The threshold gate in FIG. 3 can be defined as a majority gate having a family gate type 1, 1, 1. Similarly, the gate illustrated in FIG. 4 has a family gate type 2, 1, 1, 1. The illustrated threshold gates exemplify two of the more basic building blocks using CMOS technology which implements majority gate logic functions. As can be seen in FIG. 3, the number of MOS devices required by both the N and P channel networks in the 1, 1, 1 family gate type is 10. Similarly, the family gate type 2, 1, 1, 1 requires 14 devices. As noted earlier, family gate type 1, 1, 1 can produce up to three different, nonobvious function types, i.e. majority, AND and OR functions. The 2, 1, 1, 1 family gate type was also noted as being able to produce eight nonobvious function types. Each of the function types for a given family gate type are nonobvious because they cannot be derived from the majority function either by complementation or reordering of the inputs. The number of MOS devices that must be placed in series connection corresponds with the worst case circuit switching speed times because of the cumulative effects of adding the impedances of each MOS gate within the series. Consequently, as the number of MOS gates within the series increases, the switching speed decreases proportionally. The number of equivalent branches within the N and P channel networks corresponds to the network capacitance and therefore determines the drive capability of the output of the CMOS device. Consequently, as the number of equivalent branches increases the network capacitance increases and the drive capability diminishes. Table I, shown hereinbelow, summarizes the properties of five basic building blocks showing family gate types, the number of nonobvious function types available within that family, the number of MOS devices or complexity, the maximum number of MOS devices in series, and the equivalent number of branches or number of MOS devices connected to the output. Each succeedingly larger group of function types includes all of the function types of the previous smaller family. Table 1 shows for example, that asymmetric threshold gates provide significantly more logic capability for a given complexity than a symmetrical majority gate exemplified by the 1, 1, 1, 1, 1 family gate type. Also, a larger gate is clearly superior to the smaller gates in device count and speed.

TABLE I

| Family Gate Type | Non-obvious Function Types | Number of Devices | Maximum No. Of Devices In Series | No. Of Branches (Equivalent) |
|---|---|---|---|---|
| 1,1,1 | 3 | 10 | 2 | 2 |
| 2,1,1,1 | 8 | 14 | 3 | 2 |
| 1,1,1,1,1 | 12 | 30 | 3 | 3 |
| 2,2,1,1,1 | 12 | 18 | 3 | 3 |
| 3,2,2,2,1,1 | 26 | 34 | 4 | 4 |

The first two gate types may be used, for example, in adders and general logic, while the fourth gate type is basically a carry look ahead function plus all of its derivatives.

Thus it may be seen that there has been provided novel structure using CMOS devices for implementation of threshold gates having majority logic functions wherein the turn-on and turn-off delay times are substantially symmetrical, power consumption is relatively low, package density is high, and circuit design effort is minimized.

Obviously many modifications and variations of the invention are possible in light of the above teachings. It is therefore to be understood that within the scope of the appended claims the invention may be practiced otherwise than as specifically described.

What is claimed is:

1. A majority logic gate for indicating when the sum of the integer weights of any one of a plurality of selected combinations of a multiplicity of weighted input signals is greater than half the sum of the weights of all of the input signals, said sum of the weights of all of the input signals being an odd integer comprising, in combination: first, second and output terminals;

a first network having a plurality of parallel-connected circuits, each of said first network circuits having a plurality of source-to-drain series-connected first network MOS devices of a first channel conductivity type, each of said first network MOS devices having a gate for receiving a respective one of said input signals associated with a respective one of said selected combinations, the source of the first MOS device in each of said first network circuits commonly connected to said first terminal and the drain of the last MOS device in each of said first network circuits commonly connected to said output terminal; and a second network having a plurality of parallel-connected circuits, each of said second network circuits having a plurality of source-to-drain series-connected second network MOS devices of a second channel conductivity type opposite to said first channel conductivity type, each of said second network MOS devices having a gate for receiving a respective one of said input signals associated with a respective one of said selected combinations, the source of the first of said second network MOS device in each of said second network circuits commonly connected to said second terminal and the drain of the last MOS device in each of said second network circuits commonly connected to said output terminal;

whereby said first and second networks for a complementary MOS circuit.

2. A logic gate according to claim 1 wherein said first network MOS devices are of P type material and said second network MOS devices are of N type material.

3. A gate circuit according to claim 2 wherein said first terminal is connected to a first voltage source and said second terminal is connected to a second voltage source.

4. A logic gate according to claim 3 wherein said first voltage source has a more positive potential than said second voltage source.

5. A gate circuit according to claim 1 wherein said series connected MOS devices provide an AND logic function.

6. A gate circuit according to claim 1 wherein the common connections of said first and last MOS devices in each circuit provide a NOR logic function.

7. A majority logic gate for indicating the occurrence of any one of three selected combinations $X_1X_2$, $X_1X_3$, $X_2X_3$, drawn from three unity-weighted input signals $X_1$, $X_2$, $X_3$, comprising, in combination:

first, second and output terminals;

a first network having first, second, third, fourth and fifth P-channel MOS devices, said first P-channel device including a gate for receiving input signal $X_2$, a source connected to said first terminal and a drain, said second P-channel device including a gate for receiving input signal $X_3$, a source connected to said drain of said first P-channel device and a drain connected to said output terminal, said third P-channel device including a gate for receiving input signal $X_2$, a source connected to said first terminal and a drain, said fourth P-channel device including a gate for receiving input signal $X_3$, a source connected to said first terminal and a drain connected to said drain of said third P-channel device, said fifth P-channel device including a gate for receiving input signal $X_1$, a source commonly connected to said drains of said third and fourth P-channel devices and a drain connected to said output terminal; and a second network having first, second, third, fourth and fifth N-channel MOS devices, said first N channel device including a gate for receiving input signal $X_2$, a drain connected to said output terminal and a source, said second N-channel device including a gate for receiving input signal $X_3$, a drain connected to said source of said first N-channel device and a source connected to said second terminal, said third N-channel device including a gate for receiving input signal $X_2$, a drain connected to said output terminal and a source, said fourth N-channel device including a gate for receiving input signal $X_3$, a drain connected to said output terminal and a source connected to said source of said third N-channel device, said fifth N-channel device including a gate for receiving input signal $X_1$, a drain commonly connected to said sources of said third and fourth N-channel devices, and a source connected to said second terminal;

whereby said first and second networks form a complementary MOS circuit.

* * * * *